(12) United States Patent
Yokoyama

(10) Patent No.: US 7,709,099 B2
(45) Date of Patent: May 4, 2010

(54) BONDED BODY, WAFER SUPPORT MEMBER USING THE SAME, AND WAFER TREATMENT METHOD

(75) Inventor: Kiyoshi Yokoyama, Kirishima (JP)

(73) Assignee: Kyocera Corporation, Kyoto (JP)

( * ) Notice: Subject to any disclaimer, the term of this patent is extended or adjusted under 35 U.S.C. 154(b) by 967 days.

(21) Appl. No.: 11/479,935

(22) Filed: Jun. 29, 2006

(65) Prior Publication Data

US 2007/0199660 A1    Aug. 30, 2007

(30) Foreign Application Priority Data

Jul. 4, 2005    (JP)    ............... 2005-194837

(51) Int. Cl.
*H01L 21/306*    (2006.01)
*H01L 21/302*    (2006.01)
(52) U.S. Cl. .............. 428/621; 228/122.1; 257/709
(58) Field of Classification Search ................ 428/621; 228/122.1; 361/192; 257/709
See application file for complete search history.

(56) References Cited

U.S. PATENT DOCUMENTS 3,031,737 A * 5/1962 Conley .................... 228/122.1
5,995,357 A * 11/1999 Ushikoshi et al. ........... 361/234
6,160,244 A * 12/2000 Ohashi ..................... 219/444.1

FOREIGN PATENT DOCUMENTS

JP    10-032239    2/1998
JP    2002-164425    6/2002

OTHER PUBLICATIONS

ASM Handbook vol. 6 Welding, Brazing and Soldering, ASM International, May 1994, Brazability and Solderability of Engineering Materials by Brandi et al., pp. 617-623.*

* cited by examiner

*Primary Examiner*—Jennifer McNeil
*Assistant Examiner*—Adam C Krupicka
(74) *Attorney, Agent, or Firm*—Hogan & Hartson LLP

(57) ABSTRACT

A bonded body consisting of a ceramic member and a metal composite member of which bonding layer is less likely to be eroded by plasma is provided. The bonded body comprises the ceramic member that has two opposing main surfaces with a first metal layer provided on one of the main surfaces, the metal composite member that has two opposing main surfaces with a second metal layer provided on one of the main surfaces, and a brazing material layer that joins the first metal layer and the second metal layer, wherein the brazing material layer has an outer circumferential surface that has a depression formed therein at middle position in the direction of thickness thereof, with the depression having width at least one third the thickness of the brazing material layer.

14 Claims, 4 Drawing Sheets

BONDED BODY, WAFER SUPPORT MEMBER USING THE SAME, AND WAFER TREATMENT METHOD

BACKGROUND OF THE INVENTION

1. Field of the Invention

The present invention relates to a bonded body of a ceramic member and a metal composite member, and to a wafer support member that uses the same. The present invention also relates to a method of processing a wafer that employs the wafer support member of the present invention.

2. Description of the Related Art

For example, a film deposition apparatus or an etching apparatus is used to manufacture semiconductor chips. In such an apparatus, for example, an electrostatic chuck that utilizes electrostatic attraction to hold a wafer or an electrostatic chuck provided with a heater that heats a wafer while holding it is used as a wafer support member that holds the semiconductor wafer.

The electrostatic chuck is such a wafer support member that has electrostatic chucking electrode disposed inside of the wafer support member or on a surface opposite to a wafer mounting surface for the purpose of firmly holding the wafer during treatment, so as to attract the wafer onto the mounting surface by Johnson Rahbeck effect or Coulomb effect obtained by applying a voltage across the electrostatic chucking electrode.

The electrostatic chuck provided with heater is such a wafer support member that has enhanced function of heating the wafer due to the heating electrode disposed inside of the wafer support member or on a surface opposite to a wafer mounting surface so as to heat the wafer uniformly.

In the processes of treating semiconductor wafers (hereinafter referred to simply as wafer) for manufacturing semiconductor devices such as PVD, CVD, sputtering, SOD, SOG and other film deposition process and etching process, it is important to form a film having uniform thickness and homogeneity on the wafer or to etch the film that has been formed with uniform depth.

The wafer support member comprises a plate-shaped ceramic member of which of main surface is used as an attracting surface (mounting surface) whereon the wafer is held, and a metal-ceramics composite member (plate-like member) that is bonded to the surface of the plate-shaped ceramic member opposite to the attracting surface, where the metal-ceramics composite member is cooled by a cooling medium in order to quickly remove the heat generated in the wafer during treatment by means of plasma.

A wafer support member (electrostatic chucking stage) having such a structure as described above is described in, for example, Japanese Unexamined Patent Publication (Kokai) No. 10-32239. As shown in a sectional view of FIG. 5, the electrostatic chucking stage 50 described in patent document 1 is constituted by joining a plate-shaped sintered ceramic member 51 having an electrostatic chucking electrode 52 embedded therein and a composite plate 55 (metal-ceramics composite member) made of ceramics and aluminum by means of a bonding layer 54. Japanese Unexamined Patent Publication (Kokai) No. 10-32239 discloses the use of solder or brazing material as the bonding layer 54.

With the conventional bonded body of between the ceramic member and the metal-ceramics composite member in the wafer support member of the prior art, however, there has been such a problem that exposed surface surrounding the bonding layer 54 is exposed to plasma during the process of forming or etching the film on the wafer by means of plasma, thus resulting in the erosion of the bonding layer 54 between the ceramic member and the metal-ceramics composite member.

The erosion of the bonding layer 54 may, in the worst case, cause the ceramic member to come off the metal-ceramics composite member.

Specifically, as shown in sectional view of FIG. 6, a bonded body 60 consisting of the ceramic member 61 and the metal-ceramics composite member 65 has a site G of the maximum shear stress at the center of a brazing material layer 63, and an erosion pit is produced in the portion of G as shown in FIG. 6 when the site G of the maximum shear stress is eroded by plasma. Since the erosion pit is a very sharp defect, it acts together with the maximum shear stress so as to tear off the brazing material layer 63 that is the bonding layer, thus causing the ceramic member 61 to come off the metal-ceramics composite member 65. In this way, as the site G of maximum shear stress generated at the center of the brazing material layer 63 is exposed to plasma and eroded thereby, the bonding layer (brazing material layer 63) is significantly damaged by the bonded effects of the erosion pit and the maximum shear stress, thus resulting in destruction of the bonded body 60.

In the bonded body 60, a metal layer 62 is formed on one of main surfaces of a ceramic member 61, and a metal layer 64 is formed on one of main surfaces of the metal-ceramic composite member 65, while the metal layers 62 and 64 are joined together by means of the brazing material layer 63.

SUMMARY OF THE INVENTION

An object of the present invention is to provide a bonded body of a ceramic member and a metal composite member that has high durability against eroding or corrosive atmosphere, and a wafer support member that uses the same.

Another object of the present invention is to provide a method of processing a wafer which can be employed over a long period of time in eroding or corrosive environment.

The present inventors conducted a research for solving the problems described above, and found that durability against corrosion by plasma can be improved by forming a depression in an end face of a brazing material layer that serves as a bonding layer in the bonded body of a ceramic member and a metal composite member, and thereby completed the present invention.

The present invention provides a bonded body consisting of a ceramic member and a metal composite member of which bonding layer is less likely to be eroded by plasma.

The bonded body of the present invention comprises the ceramic member that has two opposing main surfaces with a first metal layer provided on one of the main surfaces, the metal composite member that has two opposing main surfaces with a second metal layer provided on one of the main surfaces, and a brazing material layer that joins the first metal layer and the second metal layer, wherein the brazing material layer has an outer circumferential surface that has a depression formed therein at middle position in the direction of thickness thereof, with the depression having width at least one third the thickness of the brazing material layer.

In the bonded body of the present invention, surface of the depression is preferably a curved surface.

In the bonded body of the present invention, it is preferable that depth of the depression is in a range from 0.1 to 10 times the thickness of the brazing material layer.

In the bonded body of the present invention, the depression is preferably formed by hollowing the outer circumferential surface of the brazing material layer toward the inside as a whole.

In the bonded body of the present invention, it is preferable that the outer circumferential surface is located away inward from the periphery of the first metal layer and the periphery of the second metal layer and, in which case, the distance of the outer circumferential surface from the periphery is not smaller than 0.1 times the thickness of the brazing material layer and is not larger than 0.18 times the maximum size of the first metal layer and the second metal layer.

Also in the bonded body of the present invention, the brazing material layer is preferably formed from aluminum brazing material or indium brazing material.

Also in the bonded body of the present invention, the thickness of the brazing material layer is preferably in a range from 100 ppm to 3000 ppm of the maximum size of the junction surface.

Also in the bonded body of the present invention, void ratio in the brazing material layer is preferably in a range from 1% to 10%.

The wafer support member of the present invention is characterized by the constitution that has the bonded body of the present invention in which the other main surface of the ceramic member is used as the surface whereon a wafer is mounted.

In the wafer support member of the present invention, the ceramic member may incorporate a heater therein.

In the wafer support member of the present invention, the ceramic member may incorporate an electrostatic chucking electrode therein.

The a method of processing a wafer of the present invention is characterized in that a wafer is placed on the other main surface of the wafer support member of the present invention, the wafer is heated by means of the heater and/or a voltage is applied to the electrostatic chucking electrode so as to attract the wafer, and the wafer is subjected to film deposition process using plasma or to etching process using plasma.

In the bonded body of the present invention constituted as described above, since the outer circumferential surface of the brazing material layer has the depression, of which width is not smaller than one third of thickness of the brazing material layer, formed at middle position in the direction of thickness of the outer circumferential surface, even when used under plasma in the semiconductor manufacturing apparatus, surface of the brazing material layer that is exposed in the depression can be protected from the erosion of plasma, so as to prevent the ceramic member and the metal composite member from coming apart from each other.

The wafer support member of the present invention is constituted by using the bonded body of which the brazing material layer is resistant to erosion by plasma, and therefore has improved durability.

Moreover, since the wafer support member of the present invention of which brazing material layer is less likely to be exposed to plasma and is resistant to erosion by plasma is used, the method of processing a wafer of the present invention is capable of preventing particulates from being generated by scattering of the brazing material and preventing the yield of production from decreasing due to deposition of particulates, even when the wafer is subjected to film deposition process using plasma or to etching process using plasma.

DETAILED DESCRIPTION OF THE PREFERRED EMBODIMENTS

Preferred embodiments of the present invention will now be described below with reference to accompanying drawings.

Figure 1:
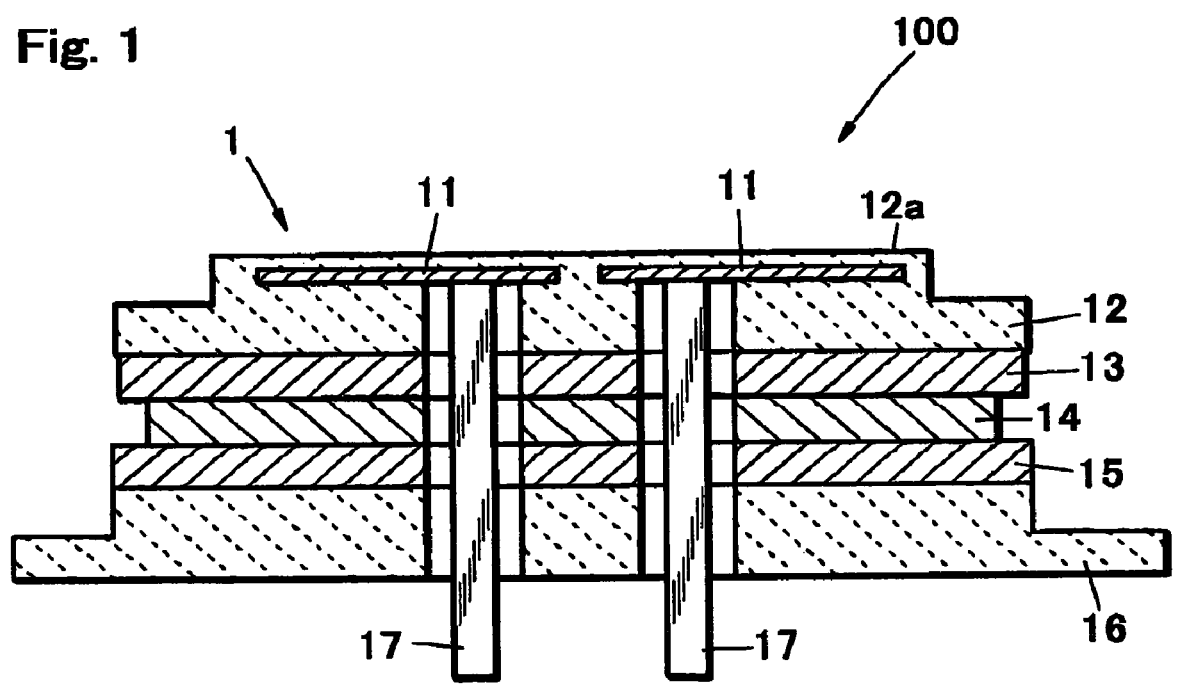
FIG. 1 is a sectional view schematically showing the constitution of the electrostatic chuck according to an embodiment of the present invention.

FIG. 1 is a sectional view schematically showing the constitution of an electrostatic chuck according to an embodiment of the present invention.

The electrostatic chuck of this embodiment is a wafer support member 100 that employs a bonded body 1 of the present invention. The bonded body 1 is made by joining a ceramic member 12 and a metal composite member 16 by means of a brazing material layer.

In the bonded body 1, a metal layer 13 is formed on one of main surfaces of a plate-shaped ceramic member 12 which incorporates an electrostatic chucking electrode 11, and a metal layer 15 is formed on one of main surfaces of the metal composite member 16, while the metal layers 13 and 15 are joined together by means of the brazing material layer 14. A hole is formed through the metal composite member 16 leading to the electrostatic chucking electrode 11 incorporated in the ceramic member 12, so that terminal 17 is connected to the electrostatic chucking electrode 11 through this hole, thus allowing it to apply a voltage to the electrostatic chucking electrode 11. The wafer support member 100 is constituted in this way.

In the wafer support member 100 constituted as described above, when a DC voltage is applied to the electrostatic chucking electrode 11, a semiconductor wafer (not shown) placed on the top surface of the ceramic member 12 is firmly attracted.

While the bonded body 1 of the present invention is made by joining the ceramic member 12 and the metal composite member 16 by bonding the metal layer 13 and the metal layer 15 by means of the brazing material layer 14, the present invention is characterized particularly by the fact that the brazing material layer 14 has a depression in the end face (outer circumferential end surface) at the middle thereof and the depression has width at least one third the thickness of the brazing material layer 14.

Figure 2:
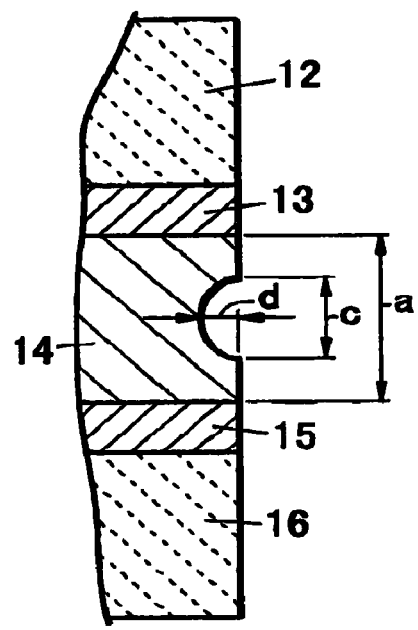
FIGS. 2A through 2F are partial sectional views of the bonded body used in the electrostatic chuck of this embodiment, showing the depression provided in the outer circumference of the brazing material layer.
Figure 2:
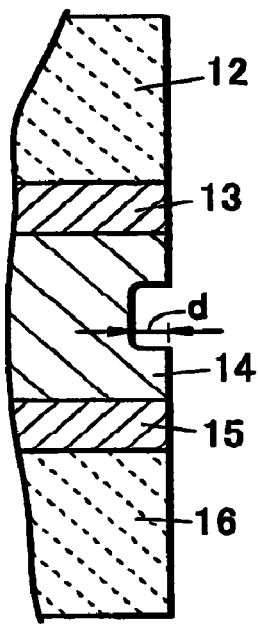
Figure 2:
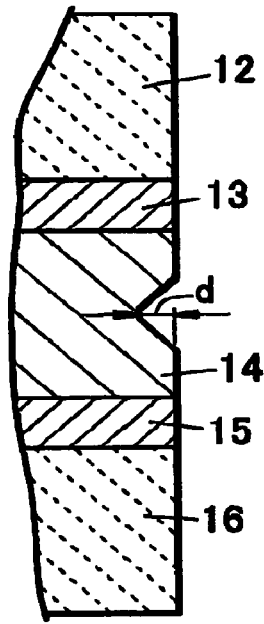
Figure 2:
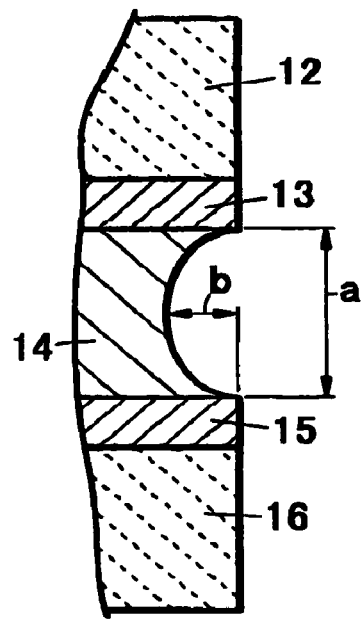
Figure 2:
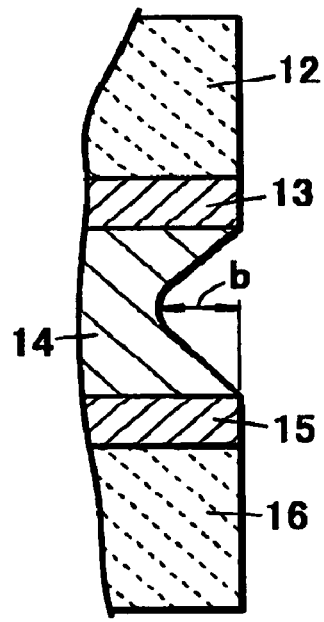
Figure 2:
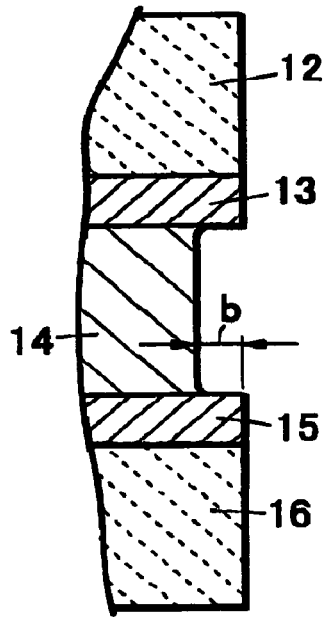

FIGS. 2A through 2F are partial sectional views of the bonded body 1 of the present invention, showing an enlarged view of the depression provided in the outer circumference of the brazing material layer 14. In the bonded body 1 of the present invention, as shown in FIGS. 2A, 2B and 2C, since the brazing material layer 14 has a depression formed therein at middle in the direction of thickness thereof and width of the depression is at least one third of the thickness of the brazing material layer 14, plasma cannot sufficiently infiltrate into the inside of the depression even when used in plasma atmosphere, thus resulting in lower density of the plasma.

Therefore, the bonding layer (the brazing material layer 14) is less likely to be eroded due to the lower density of the plasma in the depression, even when used in plasma that would otherwise erode the brazing material layer 14 that serves as the bonding layer. As a result, the central portion of the brazing material layer 14 where the maximum shear stress is generated can be protected from the plasma, so that durability and reliability of the bonded body 1 can be improved.

The surface of the depression formed in the brazing material layer 14 preferably has a curved sectional shape as shown in FIG. 2A. Curved surface of the depression makes it possible to more effectively prevent erosion of the brazing material layer 14 by the plasma. This is because not only the density of plasma in the depression becomes lower due to the curved surface, but also there is no corner that would become the start point of destruction when there is generated a shearing stress acting to peel off the bonding layer (the brazing material layer 14). For example, when there is a notched shape in the depression, destruction may start from the notched portion.

It is preferable that depth d of the depression is in a range from 0.1 to 10 times the thickness a of the brazing material layer 14. When depth of the depression is 0.1 times the thickness a of the brazing material layer 14 or larger, density of plasma in the depression becomes lower, thus making it possible to further suppress the erosion of the brazing material layer 14 by the plasma. While higher plasma density leads to faster rate of erosion, forming the depression in the bonding layer (the brazing material layer 14) makes the density of plasma in the depression lower thereby decreasing the rate of erosion.

When depth of the depression is less than 0.1 times the thickness a of the brazing material layer 14, however, plasma can enter the inside of the depression relatively easily due to the small depth d of the depression, thus making it difficult to effectively decrease the plasma density and suppress the rate of erosion. Depth of the depression is preferably not smaller than the thickness a of the brazing material layer 14, which enables it to suppress the erosion by plasma in the depression further.

In the depression formed in the outer circumferential surface of the brazing material layer, when depth d of the depression is larger than 10 times the thickness a of the brazing material layer 14, since the depression has a radius of curvature too small at the bottom as shown in FIG. 2C, there is a possibility that destruction starts at the bottom of the depression. Therefore, depth d of the depression formed in the outer circumferential surface of the brazing material layer is preferably not larger than 10 times the thickness a of the brazing material layer 14. Shape of the depression such as shown in FIG. 2A is preferable since it does not make a start point of destruction. That is, the depression is preferably formed in such a way as the end face of the brazing material layer 14 is depressed in a curved surface as shown in FIG. 2A.

It is also preferable that the end face of the brazing material layer 14 is formed in concave shape as a whole as shown in FIGS. 2D, 2E and 2F. When formed in concave shape as a whole as shown in FIGS. 2D, 2E and 2F, substantially the entire end face of the brazing material layer 14 is prevented from being exposed to plasma of high density, thus making it possible to further protect the brazing material layer 14 from the erosion by plasma. While such a depression may have various shapes, a depression having elliptical sectional shape as shown in FIG. 2D, for example, not only decreases the density of plasma in the depression but also has no sharp corner that would become a start point of destruction in the surface.

The ratio of a (thickness of the brazing material layer 14) and b (depth of the depression) in the depression is also important. Specifically, ratio b/a of the depression is preferably 0.1 or more. When ratio b/a of the depression is 0.1 or more, depth b of the depression is one tenth of thickness of the brazing material layer 14. While higher plasma density leads to faster rate of erosion when the bonding layer (brazing material layer 14) is eroded by the plasma, forming the depression in the bonding layer (brazing material layer 14) makes the density of plasma in the depression lower thereby decreasing the rate of erosion. However, when depth d of the depression is less than 0.1 times the thickness of the brazing material layer 14, plasma can enter the inside of the depression relatively easily due to the small depth of the depression, thus making it difficult to effectively decrease the plasma density and decrease the rate of erosion.

Except for the depression shown in FIG. 2F, depth b of the depression formed in the end face of the brazing material layer 14 is preferably not larger than 10 times the thickness a of the brazing material layer 14. When depth b of the depression is larger than 10 times the thickness of the brazing material layer 14, the depression has a radius of curvature too small (too sharp) at the bottom and there is a possibility that destruction starts at the bottom of the depression.

It is also preferable that the depression formed in the end face of the brazing material layer 14 is located such that the entire end face (outer circumferential surface) of the brazing material layer 14 is located to the inside of the peripheries of the metal layers 13, 15 as shown in FIG. 2F. When the upper end and the lower end of the outer circumferential surface of the brazing material layer 14 are located to the inside of the peripheries of the metal layers 13, 15, and the entire end face of the brazing material layer 14 is located to the inside of the peripheries of the metal layers 13, 15, the entire end face of the brazing material layer 14 can be protected from the erosion by plasma.

By positioning the entire end face of the brazing material layer at a position to the inside of the peripheries of the metal layers 13, 15, erosion of the brazing material layer 14 by plasma can be minimized. That is, in the case of depression formed at the center of the end face of the brazing material layer 14, while the central portion of the brazing material layer 14 where the maximum shear stress is generated can be surely protected from the erosion by plasma, the bonding layer located near the interface between the ceramic member 12 and the metal composite member 16 may be subjected to erosion by plasma. Though shearing stress is small in the region near the interface between the ceramic member 12 and the metal composite member 16, occurrence of erosion by plasma is not desirable. However, in case the entire end face of the brazing material layer 14 is located to the inside of the periphery of the metal layer 13 or 15, the entire end face of the brazing material layer 14 can be protected from erosion by plasma. In order to position the end face of the brazing material layer 14 at a position inside of the periphery of the metal layer 13 or 15, size and quantity of the brazing material may be controlled so that the end face of the brazing material layer 14 would be located at a desired position after brazing operation, by elucidating the relation between the size of the brazing material before the brazing operation and the position of the flowing brazing material after the brazing operation.

Also in case the end face of the brazing material layer 14 which is as a whole located to the inside of the peripheries of the metal layers 13, 15 as shown in FIG. 2F, distance between the end face of the brazing material layer 14 and the periphery of the metal layer 13 or 15 may be 10 times or more of the thickness of the brazing material layer 14.

The reason for setting the depth b of the depression in the end face of the brazing material layer 14 not larger than 10 times the thickness a of the brazing material layer 14 is that the radius of curvature at the bottom of the depression becomes too small and there is a possibility that destruction starts at the bottom of the depression, when depth b of the depression is larger than 10 times the thickness of the brazing material layer 14.

In case the entire end face of the brazing material layer 14 is located to the inside of the peripheries of the metal layers 13, 15, however, since width of the depression does not decrease gradually, the bottom of the depression does not make a start point of destruction.

Therefore, in such a depression as the entire end face of the brazing material layer 14 is located to the inside of the periphery of the metal layer, depth of the depression may be more than 10 times the thickness of the brazing material layer 14, and the deeper the depression the more effectively the erosion by plasma can be prevented.

However, in such a depression as the entire end face of the brazing material layer 14 is located to the inside of the peripheries of the metal layers, if depth of the depression (distance between the end face of the brazing material layer 14 and the peripheries of the metal layers 13, 15) is too large, size of the brazing material layer 14 becomes too small in comparison to the size of the metal layer, thus resulting in a large temperature difference within the surface whereon the wafer is placed.

Therefore, distance between the end face of the brazing material layer 14 and the periphery of the metal layer 13 or 15 is preferably not larger than 0.18 times the maximum size of the metal layers 13, 15.

When the distance between the end face of the brazing material layer 14 and the periphery of the metal layer 13 or 15 is larger than 0.18 times the maximum size of the metal layers 13, 15, the junction area between the brazing material layer 14 and the metal layers 13, 15 becomes smaller even if the other main surface of the ceramic member 12 is entirely covered by the metal layers 13, 15.

When junction area between the brazing material layer 14 and the metal layers 13, 15 is small, heat transfer decreases between the ceramic member 12 and the metal composite member 16, in which case the bonded body used as wafer support member will results in insufficient effect of dissipating the heat generated in the wafer through the metal composite member 16 to the outside. Insufficient heat dissipation leads to significant unevenness in temperature across the wafer surface, thus making it difficult to grow a film of uniform thickness over the wafer. This results in such troubles as lower yield of production of, for example, semiconductor chips formed on the wafer.

Therefore, the distance between the end face of the brazing material layer 14 and the periphery of the metal layer 13 or 15 is preferably not larger than 0.18 times the maximum size of the metal layers 13, 15, more preferably not larger than 0.12 times the maximum diameter of the metal layers 13, 15.

Based on the above discussion, the distance between the end face of the brazing material layer 14 and the periphery of the metal layer 13 or 15 is set to 0.1 times or more of the thickness of the brazing material layer 14, and more preferably, set 1 time or more in order to obtain greater effect of preventing plasma from intruding onto the brazing material layer 14. Also the distance between the end face of the brazing material layer 14 and the periphery of the metal layer 13 or 15 is set to 0.18 times or less, and more preferably 0.12 times the maximum diameter of the metal layers 13, 15.

Maximum size of the metal layers 13, 15 can be represented by the diameter thereof if the metal layers 13, 15 have a shape of thin disk. In case the metal layers 13, 15 have rectangular shape, maximum size of the metal layers 13, 15 can be represented by the length of the diagonal. In case the metal layers 13, 15 have about half elliptical shape, maximum size of the metal layers 13, 15 can be represented by the length of the major axis. In any case, length of the longest straight line that can be drawn in the metal layers 13, 15 is the maximum size.

Figure 3:
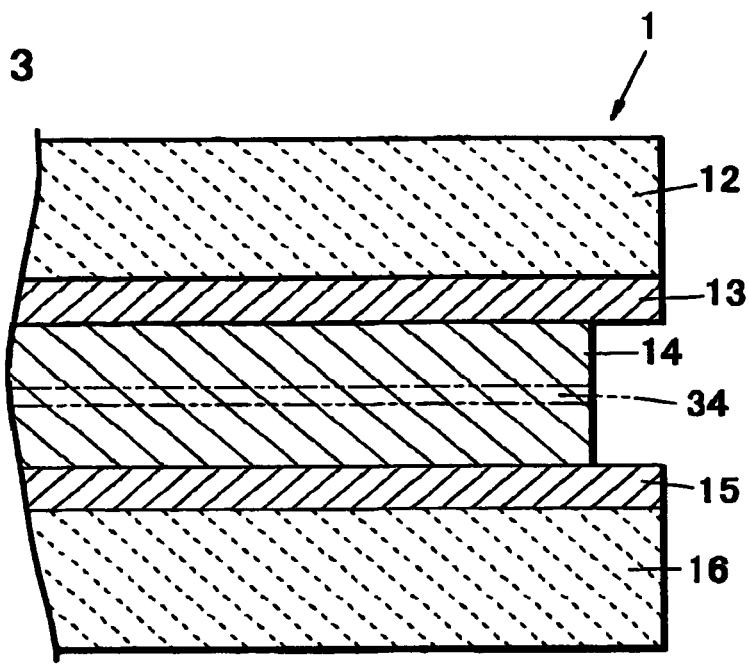
FIG. 3 is an enlarged sectional view of the depression provided on the outer circumference of the brazing material layer of the bonded body used in the electrostatic chuck of this embodiment.

The brazing material layer 14 is preferably formed from aluminum brazing material or indium brazing material. This is because, among various brazing materials, aluminum brazing material and indium brazing material are softer and easier to deform. As a result, as shown in FIG. 3 (enlarged sectional view of a depression provided on the periphery of the brazing material layer 14 of the bonded body 1 comprising the ceramic member 12 of the present invention and the metal composite member 16), even when the maximum shear stress is generated in the mid portion 34 of the brazing material layer 14, the ceramic member 12 is unlikely to crack since the brazing material layer 14 deforms. When a wafer is processed in a semiconductor manufacturing apparatus, in particular, in which case the bonded body is subjected to thermal cycles ranging from −10 to 150° C., the ceramic member 12 does not crack since the brazing material deforms during such thermal cycles. While Au—Sn brazing material may be used, Au—Sn brazing material is too hard to deform and absorb the stress, and may cause crack in the ceramic member 12 during thermal cycles ranging from −10 to 150° C.

Thickness of the brazing material layer 14 is preferably in a range from 100 ppm to 3000 ppm of the maximum size of the junction surface (interface between the metal layer and the brazing material layer). This is because, when the bonded body is used as the wafer support member in semiconductor manufacturing apparatus in which case the bonded body is subjected to a thermal cycle ranging from −10 to 150° C., the brazing material layer 14 having thickness smaller than 100 ppm of the maximum size of the junction surface cannot deform and absorb the stress generated by the thermal cycles, and may cause cracks in the ceramic member 12. In order to increase the capability of the brazing material layer 14 to deform and absorb the stress generated by the thermal cycles, the thickness is preferably 500 ppm or more which make it possible to effectively prevent cracks from occurring in the ceramic member 12. When thickness of the brazing material layer 14 is larger than 3000 ppm of the maximum size of the junction surface, plasma can easily erode the brazing material layer 14 even when the end face of the brazing material layer 14 is depressed at the center in the direction of thickness thereof to a depth one third or more of the thickness of the brazing material layer 14. As a consequence, the brazing material layer 14 is eroded by the plasma and, in the worst case, the brazing material layer may break or the ceramic member 12 to come off the brazing material layer 14. Therefore, the thickness of the brazing material layer 14 is preferably not larger than 3000 ppm of the maximum size of the junction surface. More preferably, the thickness of the brazing material layer 14 is preferably not larger than 2000 ppm of the maximum size of the junction surface so as to hinder the plasma from reaching the end face of the brazing material layer 14.

It is preferable that the brazing material layer 14 includes voids, with the void ratio preferably in a range from 1 to 10%.

Voids included in the brazing material layer 14 make it easier for the brazing material layer 14 to deform, so that cracks are less likely to occur in the ceramic member 12 even when subjected to thermal cycles. Voids included in the brazing material layer 14 are tiny cavities having size of 10 μm or less that are uniformly distributed in the brazing material layer. Void ratio can be determined by cutting off the brazing material layer 14 from the bonded body and employing Archimedes method. When void ratio in the brazing material layer 14 is less than 1%, the brazing material layer is too hard to deform during the thermal cycles, and cracks may be generated in the ceramic member 12. Therefore, void ratio in the brazing material layer 14 is preferably 1% or more. In order to make it easier for the brazing material layer 14 to deform under stress, void ratio in the brazing material layer 14 is more preferably 2% or more. When void ratio in the brazing material layer 14 is more than 10%, He infiltrates the brazing material layer 14 through the voids, thus giving rise to the possibility that the bonded body cannot be used as the wafer support member 100 of the semiconductor manufacturing apparatus. Void ratio in the brazing material layer 14 is preferably 8% or less so that He does not pass through the brazing material layer 14 even when the voids are distributed somewhat unevenly.

In the wafer support member 100 of the present invention, the ceramic member 12 has the bonded body 1 with the metal composite member 16. The ceramic member 12 is formed in a sheet shape and the other main surface of the ceramic member opposite to the main surface positioned on the side of the metal composite member 16 is used as wafer mounting surface 12a, because it is preferable to use the bonded body 1 of the present invention for the wafer support member 100 in a process for holding a wafer mounted thereon till the next process after the end of PVD process or the like.

In the wafer support member 100, it is preferable that the ceramic member 12 incorporates a heater (not shown) therein. The ceramic member 12 of the wafer support member 100 that incorporates a heater can be used in an application where a wafer is heated. The wafer support member 100 of such a constitution can be used in such applications as etching process or CVD process as the semiconductor manufacturing apparatus. Since a film is grown by means of plasma on the wafer or the film that has been formed is etched in a desired shape in these processes, direct exposure of the brazing material layer 14 to plasma is avoided in such a structure as the ceramic member 12 that incorporates a heater is joined to the metal composite member 16 by the brazing material layer 14, thus fully achieving the effects of the present invention.

In the wafer support member 100, it is also preferable that the ceramic member 12 incorporates the electrostatic chucking electrode 11 therein. Preferable constitutions for using the wafer support member 100 of the present invention in the PVD process during manufacture of semiconductor are the ceramic member 12 incorporating the electrostatic chucking electrode 11 therein and the ceramic member 12 incorporating the electrostatic chucking electrode 11 and the heater (not shown) therein. In the PVD process, a film forming material released from a target is deposited on a wafer that is held onto the ceramic member 12 of the wafer support member 100 by irradiating the target with plasma generated in the semiconductor manufacturing apparatus, thereby forming a film on the wafer. Since plasma is used also in this process, the constitution of the bonded body 1 comprising the ceramic member 12 of the present invention and the metal composite member 16 has very remarkable effect of improving the durability.

An electrostatic chuck according to one embodiment of the present invention makes it possible to transfer heat from a wafer to the wafer mounting surface 12a very efficiently since the wafer can be brought into close contact with the wafer mounting surface 12a, when the wafer is attracted onto the wafer mounting surface 12a by applying a voltage to the electrostatic chucking electrode 11. Also because the heat of the wafer mounting surface 12a can be transferred quickly to the wafer, the wafer can be heated to a desired temperature. Moreover, since the heat of the wafer mounting surface can be transferred easily to the wafer when the wafer is attracted by the electrostatic chucking electrode 11, unevenness in temperature across the wafer surface can be minimized. In case semiconductor thin film forming or etching process by means of plasma is carried out, exposure of the wafer and the wafer support member to plasma may cause the joint material to be etched and deposit on the wafer, thus resulting in such troubles as the failure to form wiring on the wafer as designed and breakage of wire. In the case of the wafer support member 100 of the present invention, in contrast, since the bonding layer is less likely to be etched due to the depression in the bonding layer, such a trouble can be prevented from occurring as corroded bonding layer deposits in the form of particulates on the wafer. As a result, wiring of devices on the wafer can be formed without breakage or short-circuiting, so that the wiring can be formed on the wafer as designed.

In case the wafer support member 100 of the present invention is used in film forming or etching in plasma atmosphere, as described above, corrosion of the bonding layer can be effectively prevented and therefore the wafer can be processed very satisfactorily with the generation of very small amount of particulates, thus providing the method of processing a wafer of high yield of production.

By providing the wafer support member that has the electrostatic chucking electrode 11 further with the heater for heating the wafer, it is made possible to heat the wafer to a desired temperature so that a film can be formed on the wafer by plasma CVD at a high temperature or to carry out etching with a high efficiency at a high temperature.

In case the wafer support member 100 of the present invention is used in film forming or etching, generation of particulates having sizes of 30 nm or larger can be effectively prevented, and therefore the wafer support member for the production of next generation semiconductor devices such as DRAM, MPU and ASIC designed to correspond to half pitch of metal wiring of 60 nm or less is provided.

Another constitution of the bonded body 1 comprising the ceramic member 12 and the metal composite member 16 of the present invention will now be described.

The ceramic member 12 is preferably made of ceramics such as aluminum nitride, aluminum oxide or silicon nitride. In case the electrostatic chuck as shown in FIG. 1 is used as the wafer support member 100 for the semiconductor manufacturing apparatus, the type of ceramics is selected according to the mechanism of attracting the wafer, Johnson Rahbeck effect or Coulomb effect. In case Johnson Rahbeck effect is employed, the ceramic member 12 is preferably made of aluminum nitride in view of the volume resistivity.

It is preferable that the metal composite member 16 has a high thermal conductivity. Concretely, the thermal conductivity of the metal composite member 16 is preferably 100 W/(m·K) or higher. When the bonded body of the present invention is used as the wafer support member 100, the metal composite member 16 which has a high thermal conductivity makes it possible to exhaust the heat generated during processing a wafer by means of plasma from the plasma processing area through the wafer support member 100 to the outside.

In addition, in order to suppress the warping from occurring when bonding the ceramic member 12 and the metal composite member 16 with the brazing material layer 14, it is preferably to make the thermal expansion coefficient of the metal composite member 16 and the thermal expansion coefficient of the ceramic member 12 as proximate to each other as possible. Concretely, the thermal expansion coefficient of the metal composite member 16 is preferably controlled within ±20%, more preferably ±10%, of thermal expansion coefficient of the ceramic member 12. While the metal composite member 16 can be formed from any material that has such a high thermal conductivity and such a thermal expansion coefficient, the metal composite member 16 is preferably made of a metal-ceramics matrix composite material or Al—Si alloy in the present invention. The Al—Si alloy is an alloy which is made by adding Al to Si.

AlSiC which is a composite material of aluminum and silicon carbide, a composite material made by mixing Si in AlSiC and a composite material made by mixing $Si_3N_4$ in AlSiC are preferably used as a metal-ceramics matrix composite material. Such materials make it possible to make the metal composite member 16 so as to have a thermal conductivity not less than 100 W/(m·K) and a thermal expansion coefficient within ±20% of the materials such as aluminum nitride, aluminum oxide and silicon nitride.

When the ceramic member 12 is made of aluminum nitride, AlSiC, a composite material made by mixing Si in AlSiC and a composite material made by mixing $Si_3N_4$ in AlSiC are more preferably as a metal-ceramics matrix composite material. Such materials have a high thermal conductivity and are easily adjusted to have thermal expansion coefficients near to aluminum nitride.

The materials other than AlSiC, a composite material made by mixing Si in AlSiC and a composite material made by mixing $Si_3N_4$ in AlSiC may be used as a metal-ceramics matrix composite material.

The Al—Si alloy is preferably adjusted to contain 55-96 wt % Si and 45-4 wt % Al. If necessary, the Al—Si alloy may have an additive such as Mg and Ni in minute amount. Such Al—Si alloy make it possible to make the metal composite member 16 so as to have a thermal conductivity not less than 100 W/(m·K) and a thermal expansion coefficient within ±20% of the ceramic member 12 which is made of aluminum nitride, aluminum oxide or silicon carbide. When the ceramic member 12 is made of aluminum nitride, the Si content of Al—Si alloy is preferably within 81-91% by weight and more preferably within 81-91% by weight. The present invention is not restricted by such composition of Al—Si alloy. When the ceramic member 12 of aluminum nitride is used, the Al—Si alloy is suitable for the metal-metal matrix composite material, since the materials have a high thermal conductivity and are easily adjusted to have thermal expansion coefficients near to the aluminum nitride.

The metal layers 13, 15 are formed on the main surfaces of the ceramic member 12 and the metal composite member 16, respectively. The metal layers 13, 15 are preferably formed from one or more kind of material selected from among Ni, Au, Ag and Cu which have high wettability with the brazing material layer 14, and more preferably formed from one or more kind of material selected from among Ni and Au which have high wettability with aluminum brazing material and indium brazing material. The metal layers 13, 15 may be formed by either plating or sputtering which allows it to easily control the film thickness.

The metal layers 13, 15 formed as described above are bonded together by means of the brazing material layer 14. Aluminum brazing material or indium brazing material is used for the brazing material layer 14. When the ceramic member 12 and the metal composite member 16 are bonded together with the brazing material layer 14, while the ceramic member 12 and the metal composite member 16 have comparable values of thermal expansion coefficient, the brazing material layer 14 is a metal which has thermal expansion coefficient that is higher than those of the ceramic member 12 and the metal composite member 16.

When the bonded body of the constitution described above is heated to the melting point of the brazing material layer 14 to join and is then cooled down to the room temperature, the brazing material layer 14 shrinks more than the ceramic member 12 and the metal composite member 16, so that maximum shear stress is generated in the middle portion 34 of the brazing material layer 14 as shown in FIG. 3. As the brazing material layer 14 has a depression formed therein at middle of the end face (a region at least one third of thickness of the brazing material layer 14) as shown in FIGS. 2A, 2B, 2C, 2D, 2E and 2F, density of plasma can be made lower in the depression so that the middle portion of the brazing material layer 14 where the maximum shear stress is generated can be prevented from being eroded by the plasma. Maximum shear stress is generated in the middle portion 34 of the brazing material layer 14, and it may seem that similar effect can be achieved with a depression formed only in a small area at the center of the brazing material layer 14. However, similar effect could not be achieved unless the depression is formed in a region of size at least one third of thickness of the brazing material layer 14. This is because, while the maximum shear stress is generated at the center, the surrounding area is also subjected to significant levels of stress. As a result, when the depression is smaller than one third of thickness of the brazing material layer 14, the area subjected to a stress near the maximum shear stress may be eroded by the plasma and, in the worst case, the bonding layer (the brazing material layer 14) may be destroyed or peel-off starts therefrom.

A method for manufacturing the bonded body 1 comprising the ceramic member 12 and the metal composite member 16 will now be described taking the wafer support member 100 as an example.

The ceramic member 12 that constitutes the wafer support member 100 may be formed from sintered aluminum nitride, although sintered silicon nitride or aluminum oxide may also be used instead. Sintered aluminum nitride is made in a process as follows. First, a mixture of aluminum nitride powder and about 15% by weight of cerium oxide is subjected to 24 to 48 hours of mixing process in a ball mill with IPA and urethane balls. Aluminum nitride slurry thus obtained is passed through 200 to 500 mesh so as to remove chips coming from the urethane balls and the ball mill wall through abrasion. The slurry is then dried at a temperature from 120 to 150° C. in an explosion-proof drier for 24 to 36 hours, so as to remove IPA, thereby to obtain uniform aluminum nitride mixture powder.

Acrylic binder and a solvent are added to the powder to make a slip of aluminum nitride, which is formed into a tape by doctor blade method. A plurality of sheets of the aluminum nitride tape are placed one on another. On the green compact thus obtained, a powder of electrically conductive material such as tungsten is applied so as to form a heat generating member by the screen printing method. Then a plurality of blank tapes with a desired bonding liquid applied thereon are placed one on another and pressed to form a green compact.

While a tape forming method is carried out as described above, a CIP method or a die pressing method may also be applied to the aluminum nitride mixture powder with an acrylic binder or paraffin wax added thereto.

The green compact thus obtained is subjected to debindering process in the stream of a non-oxidizing gas at a temperature of 300 to 700° C. for a period of 2 to 10 hours. Then the green compact is held at a temperature in a range from 1800 to 2000° C. in non-oxidizing gas atmosphere under a pressure not lower than 0.2 MPa and not higher than 200 MPa for a period of 0.5 to 10 hours, so as to sinter the green compact. The sintered aluminum nitride having the heat generating member embedded therein is thus obtained.

The sintered aluminum nitride is then machined so as to obtain the ceramic member 12 of a desired shape. Terminals 17 for applying voltage to the electrostatic chucking electrode 11 are bonded by the metallization method or the like. Then the metal layers 13, 15 are formed on the junction surface of the ceramic member 12 and on the junction surface of the metal composite member 16 that has been prepared in advance. The metal layers 13, 15 are formed, for example, by depositing Ni or the like to a thickness of 0.5 to 6 μm by sputtering or plating method.

Then with an aluminum brazing material interposed between the metal layers 13 and 15, vacuum pumping is carried out. While maintaining a degree of vacuum in a range from about $1 \times 10^{-7}$ to $1 \times 10^{-4}$ Pa, brazing is carried out at a temperature of 550 to 600° C. for a period of 5 to 300 minutes. Before bonding at a temperature of 550 to 600° C., it is preferable to replace the atmosphere with a non-oxidizing gas such as argon or nitrogen, or maintain vacuum of about 0.1 to 13 Pa while flowing such a gas, which improves the fluidity of the aluminum brazing material. Then the end face of the brazing material layer 14 is depressioned.

In this embodiment, the depression may have such a sectional shape as shown in FIGS. 2A, 2B, 2C, 2D, 2E and 2F. The sectional shapes as shown in FIGS. 2A, 2B, 2C, 2E and 2F can be formed by, for example, manually tracing the brazing material layer 14 by means of a jig that has a shape which corresponds to the sectional shape. In the case of a depression having the shape shown in FIG. 2D, it can be formed by using a material that has good wettability with the metal layers 13, 15 as the brazing material layer 14, setting the bonding temperature in a range from 550 to 600° C., and setting the ambient pressure during bonding to $10^{-4}$ Pa or lower, then replacing the atmosphere with non-oxidizing gas and controlling the pressure in a range from 0.1 to 13 Pa. Thus the wafer support member 100 of the present invention is obtained.

Example 1

In Example 1, sintered aluminum nitride made as follows was used for the ceramic member constituting the wafer support member.

First, a mixture of aluminum nitride powder and about 15% by weight or less of cerium oxide was subjected to 36 hours of mixing process in a ball mill employing IPA and urethane balls. Aluminum nitride slurry obtained by this mixing process was passed through 200 mesh so as to remove chips coming from the urethane balls and the ball mill wall through abrasion. The slurry was then dried at a temperature of 120° C. in an explosion-proof drier for 24 hours, so as to remove IPA, thereby to obtain uniform aluminum nitride mixture powder.

Acrylic binder and a solvent were mixed with the powder to make a slip of aluminum nitride, which was formed into a tape by doctor blade method. A plurality of sheets of the aluminum nitride tape were placed one on another. On the green compact thus obtained, a powder of electrically conductive material such as tungsten was applied so as to form an electro static chucking electrode and/or a heat generating member by the screen printing method. Then a plurality of blank tapes with a desired bonding liquid applied thereon were placed one on another and pressed to form a green compact measuring 450 mm in diameter and 20 mm in thickness. The green compact thus obtained was subjected to debindering process in a stream of non-oxidizing gas at a temperature of 500° C. for 5 hours. Then the green compact was held at a temperature of 1900° C. in non-oxidizing gas atmosphere under a pressure of 10 MPa or lower for 5 hours, so as to sinter the green compact. The sintered aluminum nitride having the electro static chucking electrode and/or the heat generating member embedded therein was thus obtained.

The sintered aluminum nitride thus obtained was then machined into a shape of disk measuring 320 mm in diameter and 10 mm in thickness. Terminals for applying voltage to the electrostatic chucking electrode and/or the heat generating member were bonded by the metallization method. Then metal layers were formed by plating method from Ni on the junction surface of the ceramic member and on the junction surface of the metal composite member that had been prepared in advance.

Then with an aluminum brazing material of JIS 4N04 interposed between the metal layers, vacuum pumping was carried out. While maintaining a degree of vacuum at 1.3 Pa brazing was carried out at a temperature of about 580° C. for a period of 120 minutes while flowing argon gas. Then the end face of the brazing material layer was depressioned by tracing the end face by means of a jig made of stainless steel. Thus the wafer support member of Example 1 was obtained.

In Example 1, wafer support members having different widths of the depression were made by using the jig of protruding shape capable of depressing the end face of the brazing material layer of the wafer support member that was obtained as described above. Thickness of the brazing material layer was determined by measuring the thicknesses of the ceramic member and of the metal composite member before brazing, each at 10 points, 5 points near the center and 5 points near the periphery, then measuring the thickness at the same points after brazing, and subtracting the mean thickness before brazing from the mean thickness after brazing, for the ceramic member and the metal composite member, thereby to obtain the thickness of the brazing material layer.

Then the wafer support member thus obtained was exposed to argon plasma in a vacuum chamber for 100 hours, and the state of bonding with the brazing material layer was observed before and after exposure to argon plasma. The state of bonding with the brazing material layer was evaluated by ultrasonic flaw detection method. The area of a portion, where the brazing material layer is determined to have broken or peeled off by the ultrasonic flaw detection, divided by the area of the bonding region is taken as the index of peel-off of junction after argon plasma treatment. The area of the bonding region here refers to the area of cross section that includes the bottom of depression in the brazing material layer, which is the minimum sectional area in the cross sections that are parallel to the metal layer. Zero % in this evaluation means no peel-off at all, and 100% means complete peel-off. Results of Example 1 are shown in Table 1.

TABLE 1

| Sample No. | Thickness of brazing material layer (mm) | Width of depression/ thickness of brazing material layer | Shape of depression | Peel-off of junction after argon plasma treatment |
|---|---|---|---|---|
| 11 | 0.30 | 1/1.1 | FIG. 2C | 2.0% |
| 12 | 0.30 | 1/1.5 | FIG. 2C | 2.2% |
| 13 | 0.30 | 1/2 | FIG. 2C | 2.5% |
| 14 | 0.30 | 1/2.5 | FIG. 2C | 2.7% |
| 15 | 0.30 | 1/3 | FIG. 2C | 2.9% |
| *16 | 0.30 | 1/4 | FIG. 2C | 5.0% |
| *17 | 0.30 | 1/5 | FIG. 2C | 6.0% |
| *18 | 0.30 | 1/6 | FIG. 2C | 8.0% |
| *19 | 0.30 | 0 | FIG. 2C | 10.0% |

Sample marked with * is out of the scope of the present invention.

The wafer support members of the samples Nos. 11 through 15 the wafer support members of the present invention in which the end face of the brazing material layer is depressioned at the middle in the direction of thickness over a region of size at least one third of thickness of the brazing material layer. As shown in Table 1, peel-off of junction of less than 5% was observed after argon plasma treatment in all wafer support members of the samples Nos. 11 through 15.

It was proved that the wafer support members of the present invention in which width of the depression of size one third or more of thickness of the brazing material layer are highly resistant against peel-off due to the effect of the depression formed in the end face of the brazing material layer.

The wafer support members of the samples Nos. 16 through 19 that were out of the scope of the present invention showed 5% or more peel-off of junction after argon plasma treatment, and sample No. 19 that had no depression formed therein showed destructive peel-off of junction of 10% after argon plasma treatment.

Example 2

In Example 2, wafer support member having the depression of curved surface were made and evaluated.

In Example 2, wafer support members were made by a method similar to that of Example 1. The wafer support members were made by manually tracing the surface of the brazing material by means of a jig having a protruding shape capable of depressing the brazing material layer of the wafer support member, and were evaluated similarly to Example 1. The results are shown in Table 2.

TABLE 2

| Sample No. | Thickness of brazing material layer (mm) | Width of depression/ thickness of brazing material layer | Shape of depression | Peel-off of junction after argon plasma treatment |
|---|---|---|---|---|
| 21 | 0.30 | 1/2.5 | FIG. 2C | 2.7% |
| 22 | 0.30 | 1/3 | FIG. 2C | 2.9% |
| 23 | 0.30 | 1/2.5 | FIG. 2A | 2.5% |
| 24 | 0.30 | 1/3 | FIG. 2A | 2.6% |

As shown in Table 2, it was found that less peel-off of junction occurred after argon plasma treatment in samples Nos. 23, 24 having depressiones of shape shown in FIG. 2A than in sample Nos. 21, 22 having depressiones of shape shown in FIG. 2C. The depressiones of shape shown in FIG. 2A had curved surface of half elliptical cross section.

Example 3

Wafer support members were made by a method similar to that of Example 1 by manually tracing the surface of the brazing material by means of a jig capable of depressing the brazing material layer over one third of thickness of the brazing material layer of the wafer support member as shown in FIG. 2C, while changing the depth of the depression. The wafer support members were evaluated similarly to Example 1. The results are shown in Table 3.

TABLE 3

| Sample No. | Thickness of brazing material layer (mm) | Width of depression/ thickness of brazing material layer | Shape of depression | Depth of depression/ thickness of brazing material layer | Peel-off of junction after argon plasma treatment |
|---|---|---|---|---|---|
| 31 | 0.30 | 1/3 | FIG. 2C | 0.09 | 3.5% |
| 32 | 0.30 | 1/3 | FIG. 2C | 0.10 | 2.9% |
| 33 | 0.30 | 1/3 | FIG. 2C | 1.0 | 2.4% |
| 34 | 0.30 | 1/3 | FIG. 2C | 5.0 | 2.0% |
| 35 | 0.30 | 1/3 | FIG. 2C | 10.0 | 2.9% |
| 36 | 0.30 | 1/3 | FIG. 2C | 11.0 | 3.6% |

Samples Nos. 31 through 36 shown in Table 3 are all samples within the scope of the present invention, and all showed less than 5% of peel-off of junction after argon plasma treatment.

Samples Nos. 32 through 35 having depth of the depression of the brazing material layer in a range from 0.1 to 10 times the thickness of the brazing material layer in the end face of the brazing material layer showed excellent results with 2.9% or less peel-off of junction after argon plasma treatment.

Samples Nos. 31 and 36 having depth of the depression out of the range from 0.1 to 10 times the thickness of the brazing material layer showed peel-off of junction of 3.5% and 3.6%, respectively, after argon plasma treatment. These results were inferior somewhat to those of samples Nos. 32 through 35.

Example 4

Wafer support members were made by a method similar to that of Example 1 by manually tracing the end face of the brazing material layer by means of a jig capable of depressing the brazing material layer into a shape consisting of a part of ellipse as shown in FIG. 2D over one third of thickness of the brazing material layer of the wafer support member, while changing the b/a ratio. The wafer support member was evaluated similarly to Example 1. The results are shown in Table 4.

TABLE 4

| Sample No. | Thickness of brazing material layer (mm) | Width of depression/ thickness of brazing material layer | Shape of depression | b/a ratio | Peel-off of junction after argon plasma treatment |
|---|---|---|---|---|---|
| 41 | 0.30 | 1/1 | FIG. 2D | 0.1 | 2.9% |
| 42 | 0.30 | 1/1 | FIG. 2D | 0.2 | 1.9% |
| 43 | 0.30 | 1/1 | FIG. 2D | 1.0 | 1.7% |

Samples Nos. 41 through 43 shown in Table 4 are all within the scope of the present invention, and all showed satisfactory results with 5% or less peel-off of junction after argon plasma treatment. While sample No. 41 in which the depression formed in the end face of the brazing material layer had a surface formed in the shape consisting of a part of ellipse the ratio b/a had a small value of 0.1 showed 2.5% of peel-off of junction after argon plasma treatment, and samples Nos. 42 and 43 in which b/a ratio was 0.2% or more showed greatly improved results of 1.9% or less of peel-off.

Example 5

Wafer support members were made by a method similar to that of Example 1 by manually tracing the end face of the brazing material layer by means of a jig capable of depressing the brazing material layer over the entire thickness of the brazing material layer of the wafer support member as shown in FIG. 2D, while changing the thickness of the depression. The wafer support members were evaluated similarly to Example 1. The results are shown in Table 5.

TABLE 5

| Sample No. | Thickness of brazing material layer (mm) | Depth of depression/ thickness of brazing material layer | Peel-off of junction after argon plasma treatment |
|---|---|---|---|
| 51 | 0.30 | 0.05 | 2.5% |
| 52 | 0.30 | 0.1 | 1.9% |
| 53 | 0.30 | 5.00 | 1.20 |
| 54 | 0.30 | 10.00 | 1.0% |
| 55 | 0.30 | 11.00 | 2.6% |

Samples shown in Table 5 are all within the scope of the present invention, all showing 5% or less peel-off of junction after argon plasma treatment.

Samples Nos. 52 through 54 where depth of the depression formed in a curved surface in the end face of the brazing material layer was in a range from 0.1 to 10 times the thickness of the brazing material layer showed satisfactory results with 1.9% or less peel-off of junction after argon plasma treatment.

Example 6

In Example 6, wafer support members having the end faces of the brazing material layers located at different positions were made by brazing the ceramic member, that was made from sintered aluminum nitride similarly to Example 1, and the metal composite member so that the end face of the brazing material layer was located to the inside of the peripheries of the metal layers. The size of the brazing material was controlled so that the end face of the brazing material layer would be located at a position to the inside of the peripheries of the metal layers (in a range from 0.05 times the thickness of the brazing material layer from the periphery of the metal layer to 0.25 times the maximum size of the metal layer from the periphery of the metal layer) after brazing operation, by elucidating in advance the relation between the size of the brazing material before the brazing operation and the position of the flowing brazing material after the brazing operation.

Evaluation was made similarly to Example 1.

A silicon wafer was placed on the wafer support member with warm water of 50° C. circulated through the metal composite member of the wafer support member, and temperature was measured at 5 points near the center and 5 points along the periphery of the silicon wafer, 10 points in all, by an IR camera. Uniformity of heating was evaluated by subtracting the minimum temperature from the maximum temperature of the measurements. The results are shown in Table 6.

TABLE 6

| Sample No. | Thickness of the brazing material layer (mm) | Distance between periphery of the metal layer and end face of the brazing material layer | Peel-off of junction after argon plasma treatment | Temperature difference ° C. |
|---|---|---|---|---|
| 61 | 0.30 | 0.1 times the thickness of the brazing material layer | 0.5% | 1.5 |
| 62 | 0.30 | 1.0 time the thickness of the brazing material layer | 0% | 1.2 |
| 63 | 0.30 | 10.0 times the thickness of the brazing material layer | 0% | 1.4 |
| 64 | 0.30 | 0.12 times the maximum size of the metal layer | 0% | 1.5 |
| 65 | 0.30 | 0.18 times the maximum size of the metal layer | 0% | 1.9 |
| 66 | 0.30 | 0.09 time the thickness of the brazing material layer | 0.9% | 1.3 |
| 67 | 0.30 | 0.05 times the thickness of the brazing material layer | 1.5% | 1.5 |
| 68 | 0.30 | 0.20 times the maximum size of the metal layer | 0% | 5.0 |
| 69 | 0.30 | 0.25 times the maximum size of the metal layer | 0% | 5.1 |

Samples shown in Table 6 are all within the scope of the present invention, showing excellent results of 1.5% or less peel-off of junction after argon plasma treatment, that were far smaller that the guideline of 5% that was set for the present invention.

Samples Nos. 61 through 65 in which the end face of the brazing material layer was located at a position to the inside of the peripheries of the metal layers in a range from 0.1 times the thickness of the brazing material layer to 0.18 times the maximum size of the metal layer showed the best results with 0.5% or less peel-off of junction after argon plasma treatment and temperature difference not larger than 1.9° C.

While samples Nos. 66 and 67 in which distance between the peripheries of the metal layers and the end face of the brazing material layer located to the inside thereof was 0.09 times and 0.05 times, that is smaller than 0.1 times, the thickness of the brazing material layer showed peel-off of junction of 0.9% and 1.5%, respectively, after argon plasma treatment, sample No. 61 showed peel-off of junction of 0.5% and samples Nos. 62 through 65, 68 and 69 showed no peel-off at all.

Samples Nos. 68 and 69 in which distance between the peripheries of the metal layers and the end face of the brazing material layer located to the inside thereof was 0.2 times and 0.25 times, respectively, the maximum size of the metal layer showed significant temperature differences of 5° C. and 5.1° C., respectively.

Example 7

In Example 7, wafer support members having the brazing material layers of different thicknesses were made by brazing the ceramic member that was made from sintered aluminum nitride similarly to Example 1 and the metal composite member. In Example 7, depression having width of one third of thickness of the brazing material layer and depth of 0.10 times the thickness of the brazing material layer was formed on the end face of the brazing material layer.

Then the wafer support member thus obtained was exposed to argon plasma in a vacuum chamber for 100 hours, and the state of bonding with the brazing material layer was observed before and after exposure to argon plasma. The state of bonding with the brazing material layer was evaluated by ultrasonic flaw detection method. The area of a portion where the brazing material layer was determined to have peeled off by the ultrasonic flaw detection divided by the area of the bonding region was taken as the index of peel-off of junction. Zero % in this evaluation means no peel-off at all, and 100% means complete peel-off. The wafer support member was then subjected to 200 thermal cycles each consisting of temperature change from −10 to 100° C., before checking for the occurrence of cracks in the ceramic member by fluorescent flaw detection method. Results of the measurements are shown in Table 7.

TABLE 7

| Sample No. | Width of depression/ thickness of brazing material layer | Depth of depression/ thickness of brazing material layer | Thickness of brazing material layer/maximum size of the junction surface | Peel-off of junction after argon plasma treatment | Crack in ceramic member after thermal cycles |
|---|---|---|---|---|---|
| 71 | 1/3 | 0.10 | 0.1% | 2.9% | None |
| 72 | 1/3 | 0.10 | 0.05% | 2.8% | None |
| 73 | 1/3 | 0.10 | 0.1% | 2.7% | None |
| 74 | 1/3 | 0.10 | 0.2% | 2.5% | None |
| 75 | 1/3 | 0.10 | 0.3% | 2.4% | None |
| 76 | 1/3 | 0.10 | 0.0099% | 2.9% | Present |
| 77 | 1/3 | 0.10 | 0.008% | 2.9% | Present |
| 78 | 1/3 | 0.10 | 0.301% | 4.0% | None |
| 79 | 1/3 | 0.10 | 0.35% | 4.1% | None |

Samples Nos. 71 through 75 that were within the scope of the present invention, in which thickness of the brazing material layer was in a range from 100 ppm to 3000 ppm of the maximum size of the junction surface all showed 2.9% or less peel-off of junction after argon plasma treatment, with no cracks caused in the thermal cycles.

In samples Nos. 76 and 77 having the aluminum brazing material layer with thickness less than 100 ppm of the maximum size of the junction surface, cracks occurred due to insufficient deformation of the brazing material layer to endure the thermal cycles. In samples Nos. 78 and 79 having the aluminum brazing material layer with thickness exceeding 3000 ppm of the maximum size of the junction surface, peel-off of junction after argon plasma treatment deteriorated to 4.0% and 4.1%, respectively.

Example 8

In Example 8, wafer support members having different void ratios in the brazing material layer were made by brazing the ceramic member, that was made from the sintered aluminum nitride similarly to Example 1, and the metal composite member. Void ratio in the brazing material layer was changed by controlling the load applied during brazing with the aluminum brazing material.

Figure 4:
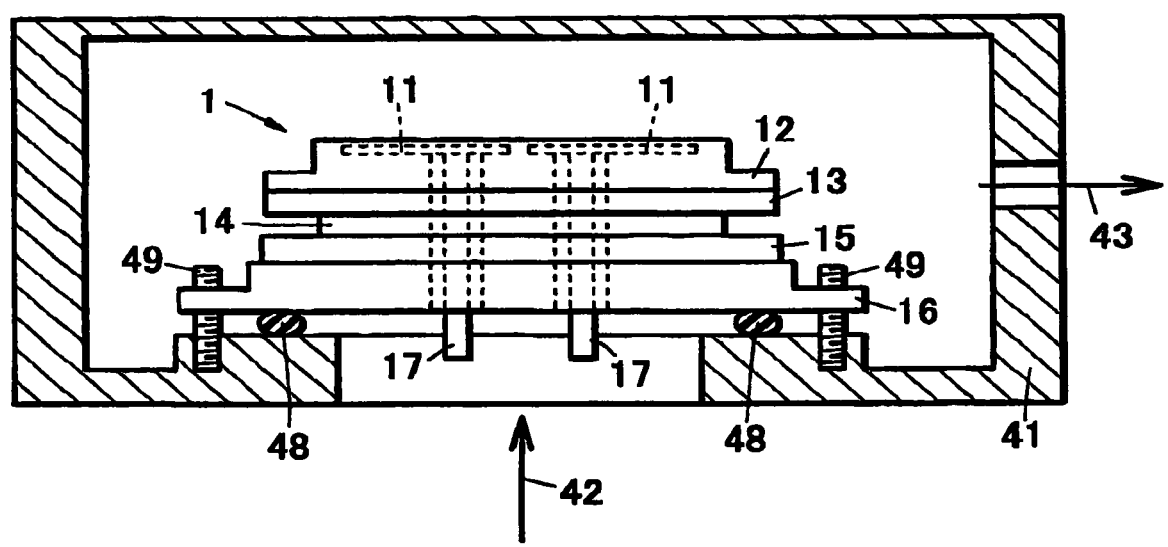
FIG. 4 is a sectional view schematically showing the measurement method of He leak test for the wafer support member of the present invention.
Figure 5:
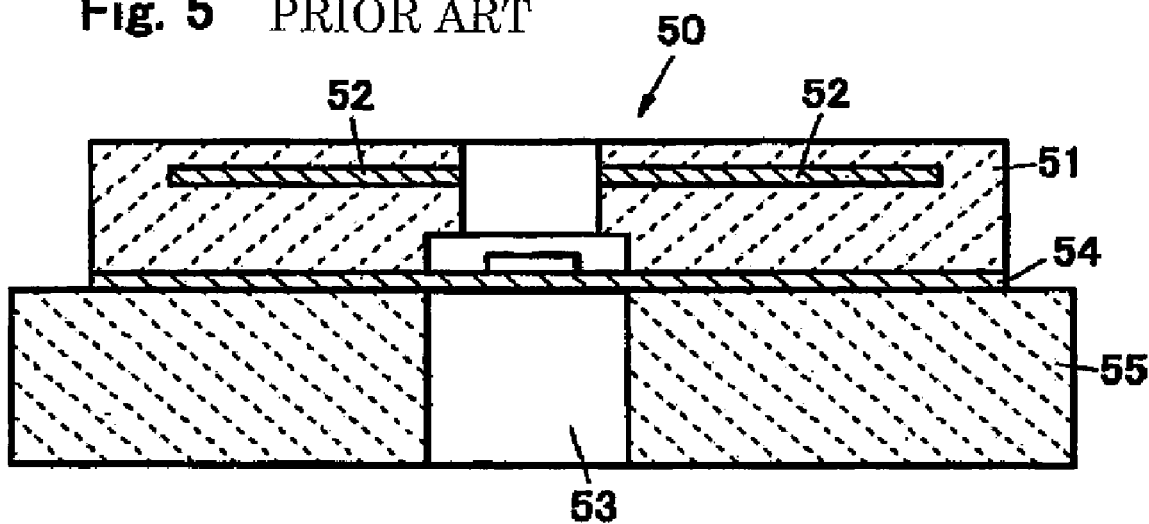
FIG. 5 is a sectional view of the bonded body comprising the ceramic member and the metal-ceramics composite member of the prior art.
Figure 6:
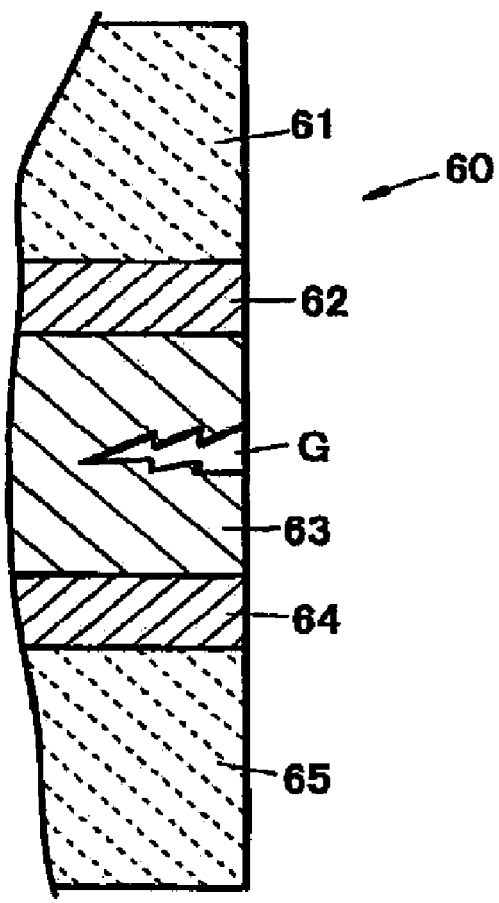
FIG. 6 is an enlarged sectional view of the outer circumference of the brazing material layer of the bonded body comprising the ceramic member and the metal-ceramics composite member of the prior art.

The wafer support member 100 thus made was sealed with an O-ring 48 and fastened with a bolt 49 in a vacuum vessel 41 shown in FIG. 4. Helium gas was supplied to flow in the direction indicated by reference numeral 42 while pumping the vessel vacuum in the direction indicated by reference numeral 43, and leakage of He was checked with a He leak detector.

The wafer support member was then subjected to 200 thermal cycles each consisting of temperature change from −10 to 100° C., before checking for the occurrence of cracks in the ceramic member 12 by the fluorescent flaw detection method. Then the aluminum brazing material layer 14 was cut off to measure the void ratio by the Archimedes method. Results of the measurements are shown in Table 8.

TABLE 8

| Sample No. | Void ratio % | He leakage | Crack in ceramic member after thermal cycles |
|---|---|---|---|
| 81 | 1.0% | None | None |
| 82 | 2.0% | None | None |
| 83 | 5.0% | None | None |
| 84 | 7.0% | None | None |
| 85 | 10.0% | None | None |
| 86 | 0.1% | None | Present |
| 87 | 0.5% | None | Present |
| 88 | 11.0% | Present | None |
| 89 | 15.0% | Present | None |

In samples Nos. 81 through 85 that were within the scope of the present invention, in which void ratio in the brazing material layer was in a range from 1 to 10%, no He leak occurred and no cracks occurred in the ceramic member after the thermal cycles.

In samples Nos. 86 and 87 in which void ratio in the brazing material layer was 0.1% and 0.5%, respectively, both lower than 1.0%, cracks occurred in the ceramic member after the thermal cycles. In samples Nos. 88 and 89 in which void ratio in the brazing material layer was 11% and 15%, respectively, both higher than 10%, and leakage of He was observed in the He leakage test shown in FIG. 4.

What is claimed is:

1. A bonded body comprising:
    a ceramic member having main surfaces opposed each other and a first metal layer formed on one of the main surfaces;
    a metal composite member having main surfaces opposed each other and a second metal layer formed on one of the main surfaces;
    a brazing material layer to bond the ceramic member and the metal composite member,
    wherein the brazing material layer has a depression in the middle of a circumference surface of the brazing material layer and wherein a width of the depression is not less than ⅓ of a thickness of the brazing material layer,
    wherein an inner surface of the depression is curved surface.

2. The bonded body according to claim 1; wherein a depth of the depression is not less than 0.1 times the thickness of the brazing material layer nor more than 10 times the thickness of the brazing material layer.

3. The bonded body according to claim 1; wherein the depression is formed by hollowing the outer circumferential surface of the brazing material layer toward the inside as a whole.

4. The bonded body according to claim 1; wherein the circumference surface is located away inward from a periphery of the first metal layer and an periphery of the second metal layer.

5. A wafer supporting member having the bonded body of claim 4;
    wherein the other main surface of the two main surfaces of the ceramic member is face on which a wafer is mounted.

6. The wafer supporting member according to claim 5;
    wherein the ceramic member has an electrostatic chucking electrode built-in.

7. The bonded body according to claim 1; wherein a distance between the periphery and the circumference surface is not less than 0.1 times the thickness of the brazing material layer nor more than 0.18 times a maximum diameter of the first metal layer and second metal layer.

8. The bonded body according to claim 1; wherein the brazing material layer is made by one material selected from a group consisting of an aluminum brazing material and an indium brazing material.

9. The bonded body according to claim 1; wherein a thickness of the brazing material layer is in a range from 0.01% of a maximum diameter of a binding face between the metal layer and the brazing material layer to 0.3% of the maximum diameter.

10. The bonded body according to claim 1; wherein a void ratio of the brazing material layer is in a range from 1% to 10%.

11. A wafer supporting member having the bonded body of claim 1;
    wherein the other main surface of the two main surfaces of the ceramic member is face on which a wafer is mounted.

12. The wafer supporting member according to claim 11;
    wherein the ceramic member has a heater built-in.

13. The wafer supporting member according to claim 12;
    wherein the ceramic member has an electrostatic chucking electrode built-in.

14. The wafer supporting member according to claim 11;
    wherein the ceramic member has an electrostatic chucking electrode built-in.

* * * * *